（12）United States Patent
Lee et al.

(10) Patent No.: US 8,117,001 B2
(45) Date of Patent: Feb. 14, 2012

(54) MEASUREMENT SYSTEM FOR CORRECTING OVERLAY MEASUREMENT ERROR

(75) Inventors: Moon-Sang Lee, Gyeonggi-do (KR);
Bong-Jin Yum, Seoul (KR); Hong-Seok Kim, Gyeonggi-do (KR); Kwan-Woo Kim, Jeollabuk-do (KR); Seung-Hyun Kim, Incheon (KR); Chan-Hoon Park, Gyeonggi-do (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/021,463

(22) Filed: Feb. 4, 2011

(65) Prior Publication Data

US 2011/0125440 A1     May 26, 2011

Related U.S. Application Data

(62) Division of application No. 12/039,479, filed on Feb. 28, 2008, now Pat. No. 7,908,105.

(30) Foreign Application Priority Data

Mar. 14, 2007    (KR) .................. 10-2007-0025142

(51) Int. Cl.
*G06F 11/00*    (2006.01)

(52) U.S. Cl. ........................................ 702/83

(58) Field of Classification Search ................ 702/83
See application file for complete search history.

(56) References Cited

U.S. PATENT DOCUMENTS 5,960,185 A    9/1999 Nguyen
(Continued)

FOREIGN PATENT DOCUMENTS

JP    2003100604    4/2003
(Continued)

*Primary Examiner* — Cindy H Khuu
(74) *Attorney, Agent, or Firm* — Muir Patent Consulting, PLLC (57) ABSTRACT

A measurement system and a measurement method, which can obtain a measurement value close to a true value considering an overlay measurement error according to a higher order regression analysis model. The measurement system and the measurement method provide a technique for determining optimal positions of shots to be measured using an optimal experimental design. When the regression analysis model and the number of shots to be measured are determined in advance, a method is used for determining an optimal number of shots to be measured according to the regression analysis model and process dispersion using a confidence interval estimating method. A dynamic sampling method is used for dynamically changing the number and positions of shots to be measured according to a change in process features by combining the above two methods. And, when erroneous data is detected, or when measured data is missing, a robust regression analysis method and a technique for filtering the erroneous data and the missing data are used.

11 Claims, 8 Drawing Sheets

U.S. PATENT DOCUMENTS

| | | | |
|---|---|---|---|
| 5,987,398 A * | 11/1999 | Halverson et al. | 702/179 |
| 6,613,589 B2 | 9/2003 | Ziger | |
| 7,062,410 B2 | 6/2006 | Winstead et al. | |
| 2002/0044269 A1 | 4/2002 | Yonekawa et al. | |
| 2003/0059691 A1 | 3/2003 | Morimoto | |
| 2003/0091914 A1 | 5/2003 | Cho | |
| 2003/0104640 A1 | 6/2003 | Ziger | |
| 2003/0152848 A1 * | 8/2003 | Leroux et al. | 430/22 |
| 2003/0199108 A1 * | 10/2003 | Tanaka et al. | 438/14 |
| 2005/0090416 A1 * | 4/2005 | Lee et al. | 510/175 |
| 2005/0095515 A1 | 5/2005 | Pellegrini | |
| 2005/0110012 A1 | 5/2005 | Lee et al. | |
| 2006/0033917 A1 * | 2/2006 | Leroux et al. | 356/401 |
| 2006/0039598 A1 * | 2/2006 | Kim et al. | 382/145 |
| 2006/0092420 A1 * | 5/2006 | Oishi | 356/401 |
| 2006/0132798 A1 * | 6/2006 | Usui et al. | 356/504 |
| 2010/0112467 A1 * | 5/2010 | Chung | 430/30 |
| 2010/0141948 A1 * | 6/2010 | Cohen et al. | 356/369 |

FOREIGN PATENT DOCUMENTS

| | | |
|---|---|---|
| JP | 2006148013 | 6/2006 |
| KR | 20060035083 | 4/2006 |

* cited by examiner

VECTOR DIAGRAM OF
ONE MISSING SHOT

FIG. 6

VECTOR DIAGRAM OF
RESIDUAL OF FIG. 5

FIG. 7

VECTOR DIAGRAM OF RESIDUAL AFTER RESTORING

FIG. 8A

VECTOR DIAGRAM FOR 24 OPTIMIZED SHOTS

FIG. 8B

VECTOR DIAGRAM FOR ALL SHOTS

FIG. 9A

VECTOR DIAGRAM FOR ALL 24 SHOTS INCLUDING ERRONEOUS DATA

FIG. 9B

VECTOR DIAGRAM
FOR ALL SHOTS
INCLUDING
ERRONEOUS DATA

FIG. 10

VECTOR DIAGRAM
AFTER RESTORING
ERRONEOUS DATA

FIG. 11

MEASUREMENT SYSTEM FOR CORRECTING OVERLAY MEASUREMENT ERROR

CROSS-REFERENCE TO RELATED PATENT APPLICATION

This application claims the benefit of priority and is a Divisional of U.S. patent application Ser. No. 12/039,479, filed Feb. 28, 2008 now U.S. Pat. No. 7,908,105, which claims the priority of Korean Patent Application No. 10-2007-0025142, filed on Mar. 14, 2007, in the Korean Intellectual Property Office, the disclosure of each of which is incorporated herein in its entirety by reference.

BACKGROUND OF THE INVENTION

1. Field of the Invention

The present invention relates to a measurement system, and more particularly, to a measurement system for accurately obtaining an overlay alignment error for a non-measured shot using a high order regression analysis model.

2. Description of the Related Art

Measurement systems used for the characterization of semiconductor devices and the like measure various quantities. For example, a photolithographic process, which is essential for the manufacture of semiconductor devices, repeatedly transfers the same pattern onto a chemical material deposited on a wafer. In general, a pattern region to be exposed by a single exposure is called a shot, and at most 100 or more shots on one paper of 300 mm are exposed. Each of the exposed shots should precisely overlay a shot of a previously formed layer.

A deviation amount of the exposed shot from the shot of the previously formed layer is measured as an overlay alignment error. When the measured overlay alignment error exceeds a desired range, a current process for a lot should be re-started. The overlay alignment error is also used to determine the amount of correction of position necessary for the exposed shot to accurately overlay the shot of the previously formed layer in a process for a subsequent lot.

In a photolithographic process used to produce semiconductor devices, instead of measuring overlay alignment errors for all shots, overlay alignment errors for some shots of a wafer selected in a lot are measured to improve production efficiency and then overlay alignment errors for all shots in the wafer are estimated using the measured overlay alignment errors for the some shots.

A regression analysis method is typically used to measure an overlay alignment error. The regression analysis method may use a regression analysis model that expresses the overlay alignment error in a function of the position of each shot in a wafer. Exposure equipment manufacturers set a specific regression analysis model, and use a regression coefficient of the regression analysis model as an equipment input value for the purpose of alignment correction because the regression coefficient helps to calculate the amount of correction of position necessary for each shot in a wafer to be correctly positioned. Accordingly, calculating a regression coefficient that can accurately provide an overlay alignment error after a photolithographic process is essential for the photolithographic process.

Conventional equipment systems for measuring an overlay alignment error set in advance the number and positions of shots to be measured according to semiconductor manufacturing processes. Accordingly, the conventional equipment systems for measuring the overlay alignment error measure the pertinent shots and output regression coefficients analyzed by a regression analysis model that uses raw data, or is already pre-determined. Accordingly, the conventional equipment systems for measuring the overlay alignment error are very difficult to freely vary the number or positions of shots to be measured in a production line.

Also, most semiconductor manufacturers use a first order regression analysis model to correct an overlay alignment error. However, in the case of the first order regression analysis model, the number or positions of shots to be measured do not greatly affect the reliability of analysis results. Therefore, relatively few attempts have been made to optimize the number or positions of shots to be measured. Some research suggests using experimental methods for repeatedly measuring an overlay alignment error with various combinations of shot numbers and positions, analyzing the measured values, and experimentally determining optimal number and positions of shots to be measured. However, it is difficult to use such an experimental method in a variety of processes and conditions.

As semiconductor devices continue to shrink in size, an overlay alignment error to be measured becomes smaller. Accordingly, analysis results obtained by a first order regression analysis model can no longer satisfy accuracy sufficient for correction of an overlay alignment error. Exposure equipment producers have developed exposure equipment that can form a circuit with a fine line-width by upgrading a light source and hardware, and can be provided with an accurate correction function using a high order regression analysis model.

In the case of the high order regression analysis model, the number and positions of shots to be measured greatly affect the reliability of analysis. Since the high order regression analysis model should measure a greater number of shots than a first order regression analysis method, the positions of shots to be measured need to be optimized in order to achieve highest analysis reliability with least shots. When the positions of shots to be measured are optimized, maximum analysis reliability can be achieved even when the same number of shots are measured.

Furthermore, the reliability of analysis varies depending on the condition of a semiconductor manufacturing process. That is, when the reliability of analysis necessary for accurate correction of an overlay alignment error is fixed and a semiconductor manufacturing process is stably performed, the number of shots to be measured necessary to obtain the reliability of analysis is relatively small, but when the reliability of analysis is fixed and a semiconductor manufacturing process is unstably performed, the number of shots to be measured to obtain the reliability of analysis is relatively large.

Moreover, in order to stably operate a system that can measure a smallest possible number of shots and can accurately correct an overlay alignment error, erroneous data should be detected and filtered. As the order of a regression analysis model increases, the effect of each piece of measured data on regression analysis increases. The effect of each measured data on the regression analysis increases further when the number of measured shots decreases. Accordingly, when the erroneous data is directly used in regression analysis without being filtered, analysis results are greatly distorted. The distortion drastically reduces the accuracy of the correction of overlay alignment errors for subsequent lots. The erroneous data may be caused when overlay marks are damaged due to particles on a wafer during operation or due to other processing. Accordingly, effectively filtering the erroneous data is essential for stably operating the system for accurately correcting the overlay alignment error.

Erroneous data is detected by observing the absolute size of data. That is, after regression analysis, when data has a size or a residual, which is unusually larger than that of other data, the data is detected as erroneous data.

Once erroneous data is detected using a least squares method, regression analysis is performed again on data other than the erroneous data. However, it is possible that a method for detecting erroneous data using a least squares method fails to detect the erroneous data, or mistakes normal data for the erroneous data and removes the normal data. The normal data mistaken for the erroneous data may distort estimates of overlay alignment errors for shots around measured shots. Accordingly, accurate data cannot be obtained using only the conventional method for detecting erroneous data.

SUMMARY OF THE INVENTION

The present invention provides a measurement system that can obtain a measurement value close to a true value considering an overlay alignment error according to a high order regression analysis model.

According to one aspect of the present invention, a semiconductor measurement system is structured to determine an optimal number and position of a group of n shots to be measured from a plurality of m shots of a semiconductor wafer, to detect erroneous data in the measurement of an overlay alignment error for each of the n shots, and to restore the erroneous data with estimated good data using a regression analysis.

According to another aspect of the present invention, the measurement system is structured to obtain measurement values of the n shots, the measurement values including the overlay alignment errors, the measurement system being structured to establish an optimal criterion that maximizes $(X^TX)$ of a matrix X of a function for a second or higher order regression analysis model.

The optimal criterion may be a D-optimal criterion, an A-optimal criterion, a G-optimal criterion, or a V-optimal criterion that minimizes the size of a confidence interval of an estimate of a regression coefficient given in the function for the second or higher order regression analysis model.

The overlay alignment error may be optimized by selecting one group of n shots making sure that $\det(X^TX)$, (i.e., the determinant of $(X^TX)$), is maximized when the regression analysis model and the number n of shots to be measured in m measurable shots are determined in advance, among a plurality of groups each including n shots.

According to another aspect of the present invention, there is provided a measurement system structured to correct an overlay measurement error using a second or higher order regression analysis model, the measurement system being structured to select a least number of targets to be measured making $100(1-\gamma)$ % certain that the length of a $100(1-\alpha)$ % prediction interval for an estimate of the overlay measurement error is less than 2w, wherein γ is about 0.1, α is about 0.05, and w is ((confidence upper limit) minus (confidence lower limit))/2.

The overlay alignment error may be optimized by selecting a least number of shots giving $100(1-\gamma)$ % certainty when the regression analysis model and the number n of shots to be measured in m measurable shots are determined in advance, among a plurality of groups each including n shots.

According to another aspect of the present invention, there is provided a measurement method for correcting an overlay measurement error, the measurement method including: arbitrarily selecting n targets to be measured among m measurable targets; obtaining $(X^TX)$ for a matrix X of a function of a second or higher order regression analysis model from the n targets to be measured; replacing one of the selected n targets to be measured with one of unselected (m−n) targets and obtaining $(X_1^TX_1)$ for a new matrix $X_1$; and if the $(X_1^TX_1)$ is greater than the $(X^TX)$, replacing one of the selected n targets with one of the unselected (m−n) targets when a difference between the $(X_1^TX_1)$ and $(X^TX)$ is largest, and if the $(X_1^TX_1)$ is less than the $(X^TX)$, determining the selected n targets to be measured which construct the $(X^TX)$ as targets to be measured.

The targets to be measured may be shots in a photolithographic process.

When the $(X^TX)$ increases, maximum and minimum values of a residual of the analyzed measurement value may decrease. When the $(X^TX)$ increases, a standard deviation of a residual of the analyzed measurement value may decrease. The measurement value may be any one selected from the group consisting of position, thickness, and temperature. The overlay measurement error may be an overlay alignment error in a photolithographic process. Further, the targets to be measured may be shots in a photolithographic process.

According to another aspect of the present invention, there is provided a measurement method for correcting an overlay measurement error, the measurement method including: in a function of a second or higher order regression analysis model for obtaining an overlay measurement error of a measurement value that is repeatedly determined, detecting missing data or erroneous data; filtering and restoring the data; and performing second or higher order regression analysis using the restored data.

The measurement value may be a position of a shot in a photolithographic process.

The restoring of the data may include removing the data, performing first order regression analysis, and replacing the missing data or the erroneous data with data obtained by the first order regression analysis.

The restoring of the data may also include: obtaining a regression coefficient using a least squares method; obtaining an updated regression coefficient from the regression coefficient using a weight function; and if a difference between the updated regression coefficient and the regression coefficient before being updated is greater than a predetermined threshold, repeating the operation of obtaining the updated regression coefficient, and if the difference between the updated regression coefficient and the regression coefficient before being updated is less than the predetermined threshold, determining the updated regression coefficient as a regression coefficient of the function of the second or higher order regression analysis model.

The weight function may be any one selected from the group consisting of an Andrew function, a Bisquare function, a Cauchy function, a Fair function, and a Huber function.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. While the present invention has been particularly shown and described with reference to exemplary embodiments thereof using specific terms, the embodiments and terms have been used to explain the present invention and should not be construed as limiting the scope of the present invention defined by the claims. Accordingly, it will be understood by those of ordinary skill in the art that various changes in form and details may be made therein without departing from the spirit and scope of the present invention as defined by the following claims. Like reference numerals denote like elements throughout.

The embodiments of the present invention provide a measurement system, which can obtain a measurement value considering an overlay measurement error according to a high order regression analysis model, and a measurement method using the measurement system. The embodiments of the present invention will now be explained in the following order.

Optimal positions of shots to be measured using an optimal experimental design will be first explained. Next, determining an optimal number of shots to be measured according to a regression analysis model and a process dispersion using a confidence interval estimating method will be explained. Then, a dynamic sampling technique for dynamically changing the number and positions of shots to be measured by combining the above two techniques will be explained. Finally, restoring data when erroneous data is detected or when measured data is missing, and a technique for filtering the erroneous data using a robust regression. analysis technique will be explained.

The embodiments of the present invention deal with an overlay alignment error as an example of an overlay measurement error. Accordingly, the present invention can be applied to measurement values other than the overlay alignment errors without departing from the scope of the present invention. For example, while the embodiments of the present invention deal with an overlay alignment error in a photolithographic process, the present invention can be applied to measurement values, e.g., position, thickness, and temperature, in other processes.

I. Optimizing Positions of Shots to be Measured Using an Optimal Experimental Design Optimizing positions of shots to be measured using an optimal experimental design includes determining in advance optimal positions of shots to be measured. A regression analysis model used for overlay alignment error analysis, and the number of shots to be measured, may also be determined in advance. The optimization may be performed by a sampler optimization component of the semiconductor measurement device.

A regression analysis model according to an embodiment of the present invention is given by $$dx_i = F(x_i, y_i)K_x + \varepsilon_{xi} \quad (i \in [1, n]) \quad (1)$$
$$dy_i = F(x_i, y_i)K_x + \varepsilon_{yi}$$

where $dx_i$ and $dy_i$ are overlay alignment errors in X and Y directions measured on an $i^{th}$ shot, $x_i$ and $y_i$ are X and Y coordinates of the $i^{th}$ shot on a wafer, $F(x_i, y_i)$ is a vector function of $[f_1(x_i, y_i) f_2(x_i, y_i) \ldots f_m(x_i, y_i)]$, which represents an order of the regression analysis model, $K_x$ is a regression coefficient that is $[k_{x1} k_{x2} \ldots k_{xm}]^T$, $K_y$ is a regression coefficient that is $[k_{y1} k_{y2} \ldots k_{ym}]^T$, $\varepsilon_{xi}$ and $\varepsilon_{yi}$ are residuals of overlay alignment errors measured on the $i^{th}$ shot, a normal distribution of a mean of zero (0) and variances of $\sigma_x^2$ and $\sigma_y^2$ is displayed, and n is the number of experimental points included in the experimental design.

Equation 1 is written in matrix form as $$D_x = XK_x + E_x$$
$$D_y = XK_y + E_y \quad (2)$$

where $D_x$ is $[d_{x1} d_{x2} \ldots d_{xn}]^T$, $D_y$ is $[d_{y1} d_{y2} \ldots d_{yn}]^T$, $E_x$ is $[\varepsilon_{x1} E_{x2} \ldots \varepsilon_{xn}]^T$, $E_y$ is $[\varepsilon_{y1} \varepsilon_{y2} \ldots \varepsilon_{yn}]^T$, and X is a matrix whose $i^{th}$ row is $F(x_i, y_i)$.

A variance-covariance matrix of an estimate of a regression coefficient obtained by a least squares estimator is given by $$\mathrm{Cov}(\hat{K}_x) = \sigma_x^2 (X^T X)^{-1}$$
$$\mathrm{Cov}(\hat{K}_y) = \sigma_y^2 (X^T X)^{-1} \quad (3).$$

A Variance $V(d\hat{x})$, $V(d\hat{y})$ of an estimate $d\hat{x}$, $d\hat{y}$ of an overlay alignment error for a shot (x, y) is given by $$V(d\hat{x}) = \sigma_x^2 F(x,y)(X^T X)^{-1} F(x,y)^T$$
$$V(d\hat{y}) = \sigma_y^2 F(x,y)(X^T X)^{-1} F(x,y)^T \quad (4).$$

Equations 3 and 4 are dependent on $(X^T X)^{-1}$. Accordingly, when a residual component acting as noise exists, in order to obtain a $\hat{K}_x$, $\hat{K}_y$ or $d\hat{x}$, $d\hat{y}$ close to a true value, an optimal design should be established to achieve a smallest possible $(X^T X)^{-1}$. A criterion for achieving the smallest possible $(X^T X)^{-1}$ is called an optimal criterion. There are various optimal criteria for the optimal experimental design.

There are a D-optimal criterion and an A-optimal criterion which can reduce a variance of an estimate $\hat{K}_x$, $\tilde{K}_y$ of a regression coefficient. The D-optimal criterion, which is for minimizing the size of a simultaneous confidence interval of estimated regression coefficients, minimizes $\det(X^TX)^{-1}$, that is, maximizes $\det(X^TX)$. In general, most of statistical software systems use the D-optimal criterion for an optimal experimental design. The A-optimal criterion, which is for minimizing a sum of variances of estimated regression coefficients, minimizes a sum of diagonal components of a matrix $(X^TX)^{-1}$.

There are also a G-optimal criterion and a V-optimal criterion which minimize variances of estimates. The G-optimal criterion, which is for minimizing a maximum value of $V(d\hat{x})$, $V(d\hat{y})$ in an overall experimental region, minimizes $$\underset{(x,y) \in C}{\text{MAX}}\{F(x, y)(X^TX)^{-1}F(x, y)^r\}$$

where C is a set of all experimental points that can be considered. The V-optimal criterion, which is for minimizing a sum of variances of estimates in an overall experimental region, minimizes $$\sum_{(x,y) \in C}\{F(x, y)(X^TX)^{-1}F(x, y)^r\}.$$

To establish an optimal experimental design, experimental points that can satisfy suggested criteria are selected from all possible experimental points that can be taken into account. Results of the established experimental design may be slightly varied according to which criterion is used. However, since basic concepts of the criteria are similar to one another, the variation is insignificant. Accordingly, the D-optimal criterion is employed in the present embodiment.

Optimizing positions of shots to be measured using an optimal experimental design and an overlay alignment error will now be explained. First, an overlay alignment error and an optimal experimental design necessary for optimizing positions of shots to be measured are used as follows. The optimal experimental design may use a D-optimal criterion as described above. Specifically, when a regression analysis model for overlay alignment error analysis is determined in advance, and the number of shots to be measured is determined in advance to be n, the n shots to be measured are selected from all measurable shots, thereby obtaining a matrix X thereof. Next, among a plurality of groups, each including n shots, one group of n shots ensuring that $\det(X^TX)$ is maximized is selected.

However, when the number of the measurable shots is m and the number of the shots to be measured is n, the number of cases where n shots are selected from m shots is ${}_mC_n$. The number of methods of searching an optimal criterion for the cases and finding a global optimal solution increases in an exponential function. Accordingly, it is difficult or impossible to obtain the global optimal solution. The present embodiment may use an algorithm that can find a sub-optimal solution for a rational calculation.

Examples of the algorithm include a sequential algorithm, an exchange algorithm, a Detmax algorithm, an M_Fedorov algorithm, and a Fedorov algorithm. The algorithms have been adjusted to be suitable for a semiconductor photolithographic process so as to optimize positions of shots whose overlay alignment errors are to be measured. Since two or more experiments on the same experimental point are advantageous to a general optimal experimental design, the same experimental point can be selected two or more times. However, since it is meaningless to measure one shot two or more times in a photolithographic process, one experimental point is not selected two or more times.

Figure 1:
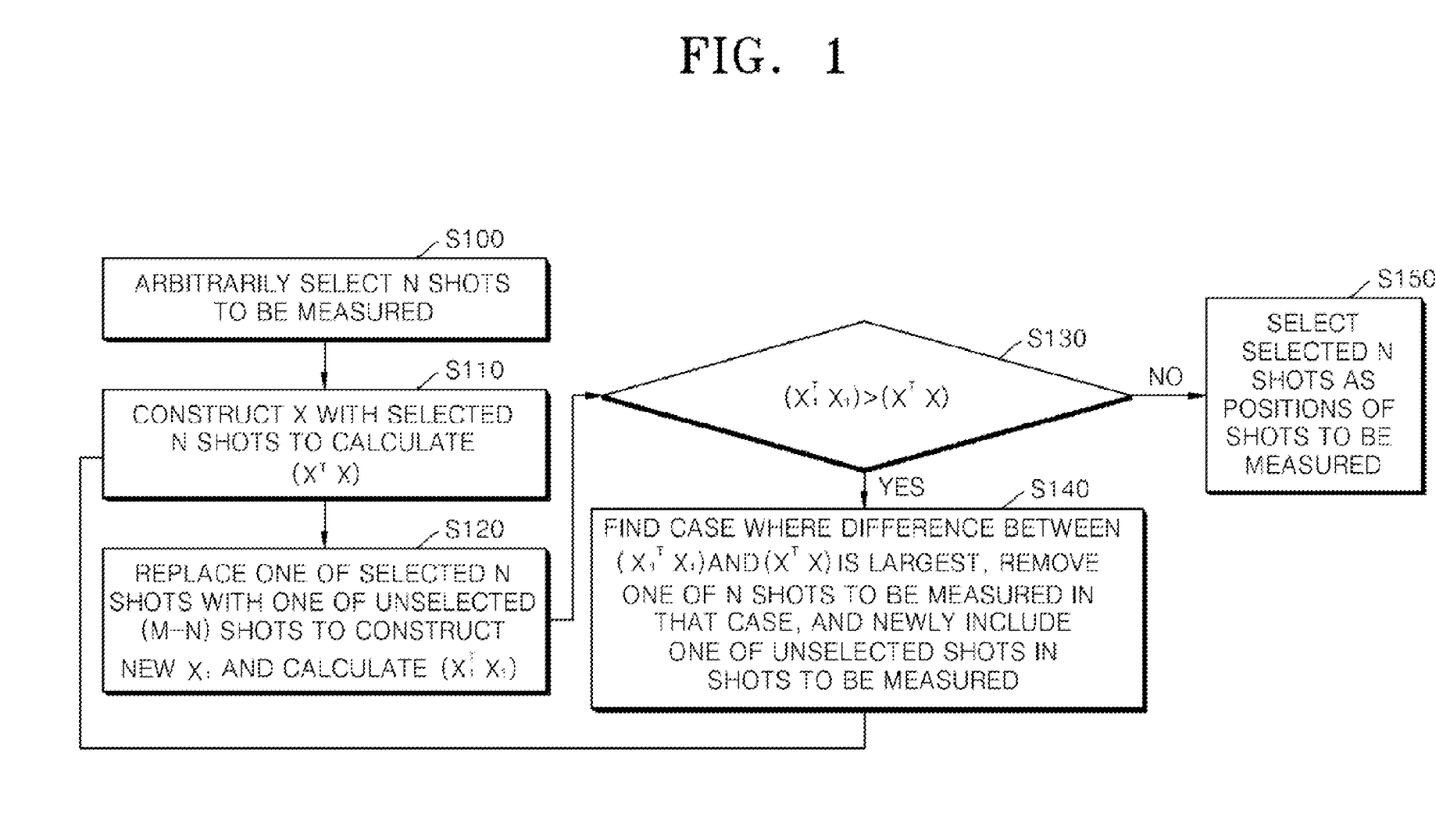
FIG. 1 is a flowchart illustrating a technique for optimizing positions of shots to be measured using an optimal experimental design according to an embodiment of the present invention.

FIG. 1 is a flowchart illustrating a technique for optimizing positions of shots to be measured using an optimal experimental design according to an embodiment of the present invention.

Referring to FIG. 1, in operation S100, n shots to be measured are arbitrarily selected from m measurable shots. That is, the m measurable shots are divided into the arbitrarily selected n shots and unselected (m−n) shots. Optionally, the n shots may be determined using an initial solution determining method for positions of shots to be measured. Since an initial solution can affect a calculation time of a sub-optimal solution, the initial solution can be determined using a certain tendency of a sub-optimal solution according to a regression analysis model used in overlay alignment error analysis. For example, as the order of the regression analysis model increases, shots to be measured tend to be centered on a certain point. That is, the shot centered on the certain point can be determined as an initial solution.

In operation S110, the afore-described matrix X is constructed with the n shots to be measured so as to calculate $(X^TX)$. In operation S120, one of the selected n shots is replaced by one of the unselected (m−n) shots to construct new $X_1$ and calculate $(X_1^TX_1)$. In operation 5130, the $(X_1^TX_1)$ and the $(X^TX)$ are compared with each other. If it is determined in operation S130 that the $(X_1^TX_1)$ is greater than the $(X^TX)$, the process proceeds to operation S140. In operation S140, in a case where a difference between the $(X_1^TX_1)$ and the $(X^TX)$ is largest, one of the n shots to be measured is removed and one of the unselected shots is newly included in the shots to be measured. Next, the matrix X is constructed, and then the above process is repeated. However, if it is determined in operation 5130 that the $(X_1^TX_1)$ is less than the $(X^TX)$, the process proceeds to operation S150. In operation S150, positions of the n shots to be measured are finally determined as positions of shots to be measured.

Since positions of shots to be measured are determined to maximally satisfy an optimal experiment criterion and an optimal criterion for an overlay alignment error according to the present embodiment, overlay alignment error analysis can be stably performed.

Figure 2:
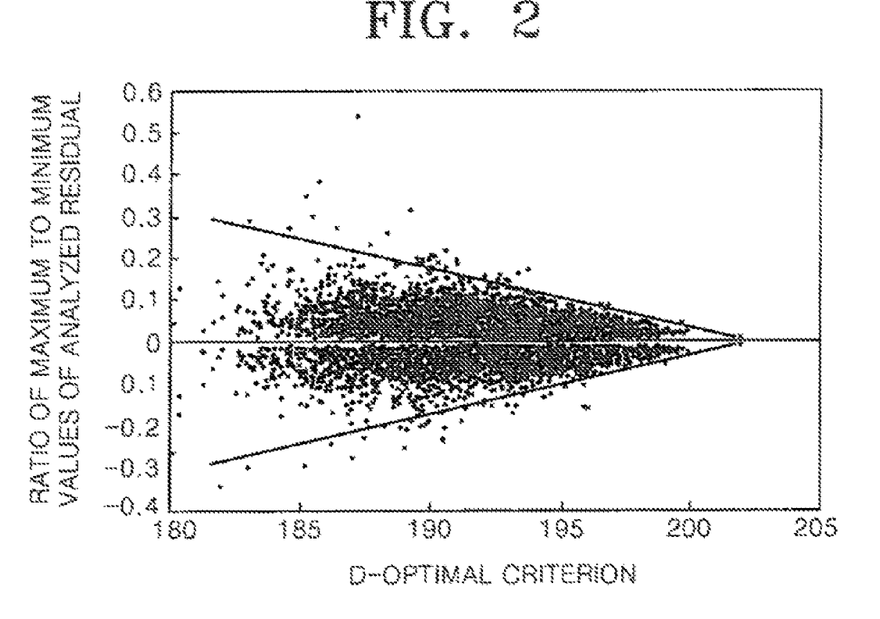
FIG. 2 is a graph illustrating a relationship between a D-optimal criterion and a ratio of maximum to minimum values of an analyzed residual.
Figure 3:
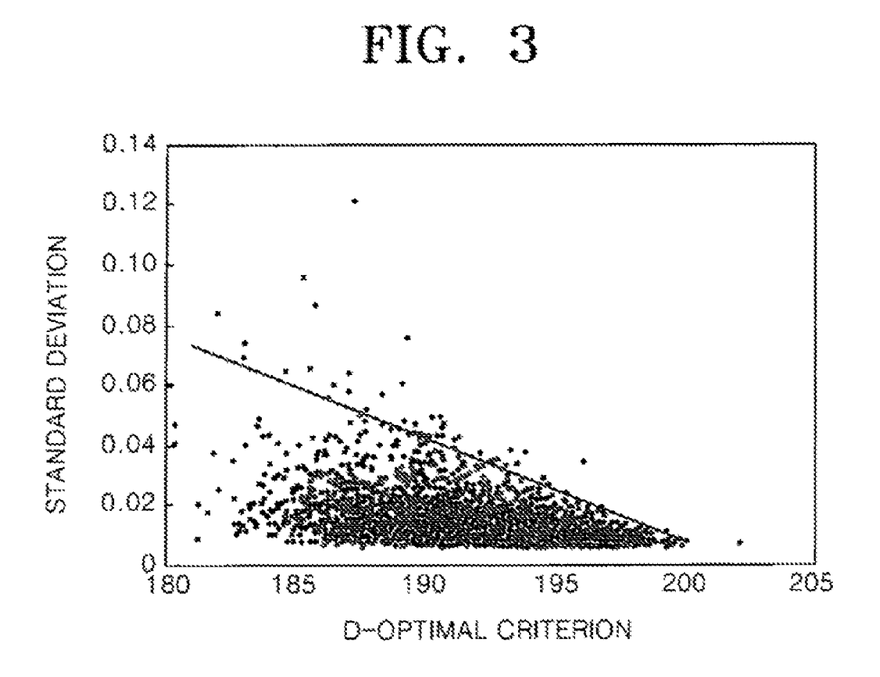
FIG. 3 is a graph illustrating a relationship between the D-optimal criterion and a standard deviation of the analyzed residual.

FIG. 2 is a graph illustrating a relationship between a D-optimal criterion and a ratio of maximum to minimum values of an analyzed residual. FIG. 3 is a graph illustrating a relationship between the D-optimal criterion and a standard deviation of the analyzed residual. Here, after virtual overlay alignment error data of measurable shots (all shots) in which a certain level of noise was generated, 17 shots to be measured were arbitrarily extracted in 1000 different ways and a regression coefficient for a third order regression model was obtained using only overlay alignment error data of the arbitrarily extracted shots. Residual components of overlay alignment errors for all the shots were calculated using the regression coefficient, and relationships between a D-optimal criterion and a ratio of maximum to minimum values of each of the residual components and between the D-optimal criterion and a standard deviation of the residual component were displayed as scatterplots. The D-optimal criterion may be determined to be $(X^TX)$.

Referring to FIGS. 2 and 3, as the D-optimal criterion calculated with positions of the measured shots increased, the ratio of the maximum to minimum values or the standard deviation of the analyzed residual decreased. When the positions of the measured shots were selected to have a high D-optimal criterion, a regression coefficient obtained using only overlay alignment error data measured on the selected shots to be measured was close to a regression coefficient obtained using data of all the shots. Accordingly, when positions of shots to be measured are optimized as described above, an overlay alignment error can be more accurately analyzed.

II. Determining an Optimal Number of Shots to be Measured According to a Regression Analysis Model and a Process Dispersion Prediction interval estimation refers to the prediction of an interval, not a value, in which measurement values of shots are contained using process dispersion and the distributions of the measurement values. The prediction interval estimation is performed by setting a confidence level and searching for an interval containing measurement values. A $100(1-\alpha)$ % prediction interval [L, U] for a predicted value $\theta$ satisfies $1-\alpha$. Here, L and U are a confidence upper limit and a confidence lower limit, respectively, and w is $(L-U)/2$, that is, a desired precision. Since an estimated precision for a measurement value of each shot is determined by w, the number of shots to be measured should be determined to have a desired precision "w" while making $100(1-\alpha)$ % certain that a prediction interval contains a measurement value of each shot.

When regression analysis is performed with overlay alignment error measurement values for n shots using a regression analysis model such as Equation 1, a $100(1-\alpha)$ % prediction interval in which an overlay alignment error value of a shot (xf, yf) in x and y directions is contained is given by X component: $(-t_{n-p,1-\alpha/2} \cdot s_x \sqrt{v}, t_{n-p,1-\alpha/2} \cdot s_x \sqrt{v})$ Y component: $(-t_{n-p,1-\alpha/2} \cdot s_y \sqrt{v}, t_{n-p,1-\alpha/2} \cdot s_y \sqrt{v})$ where $v = F(x_f, y_f)^T (X^T X)^{-1} F(x_f, y_f)$, p is the number of estimated regression coefficients, and $\epsilon_x$ and $\epsilon_y$ are standard deviations of measured values. That is, the number n of shots to be measured for giving $100(1-\gamma)$ % certainty that the length of a prediction interval is less than 2w, considering a change in the length of the prediction interval may be defined by $$w = t_{x-y,1-\alpha/2} \cdot \sigma_x \left( \frac{\chi^2_{1-y,x-\gamma}}{n-p} \right)^{1/2} \sqrt{v} \quad (6)$$

$$w = t_{x-y,1-\alpha/2} \cdot \sigma_y \left( \frac{\chi^2_{1-y,x-\gamma}}{n-p} \right)^{1/2} \sqrt{v}$$

where $\sigma_x$ and $\sigma_y$ are process dispersions of overlay alignment errors in the x and y directions, and the number n is the least number of shots making $100(1-\gamma)$ % certain that the length of a $100(1-\alpha)$ % prediction interval is less than 2w for an overlay alignment error estimate for which a shot $(x_f, y_f)$ is measured. Hence, when $\alpha$, $\gamma$ and w are determined and the $\sigma_x$ and $\sigma_y$ are known, the number n of shots to be measured can be obtained. An overlay alignment error specification may be referred to for the precision "w", and the $\alpha$ and $\gamma$ may be $\alpha=0.05$ and $\gamma=0.1$ which are often used in statistical analysis. While it is preferable that the $\sigma_x$ and $\sigma_y$ are obtained by performing the process data analysis, when there is no sufficient process data, the $\sigma_x$ and $\sigma_y$ may be slightly greater than predicted process dispersions for process stability. The optimal number of n shots may be determined by the sampler optimization component of the semiconductor measurement device.

III. Dynamic Sampling

The method for optimizing positions of shots to be measured and the method for determining the number of shots to be measured may be combined to use a dynamic sampling method. The dynamic sampling method can ensure desired analysis accuracy even though process dispersions, specifications, and so on are changed.

Figure 4:
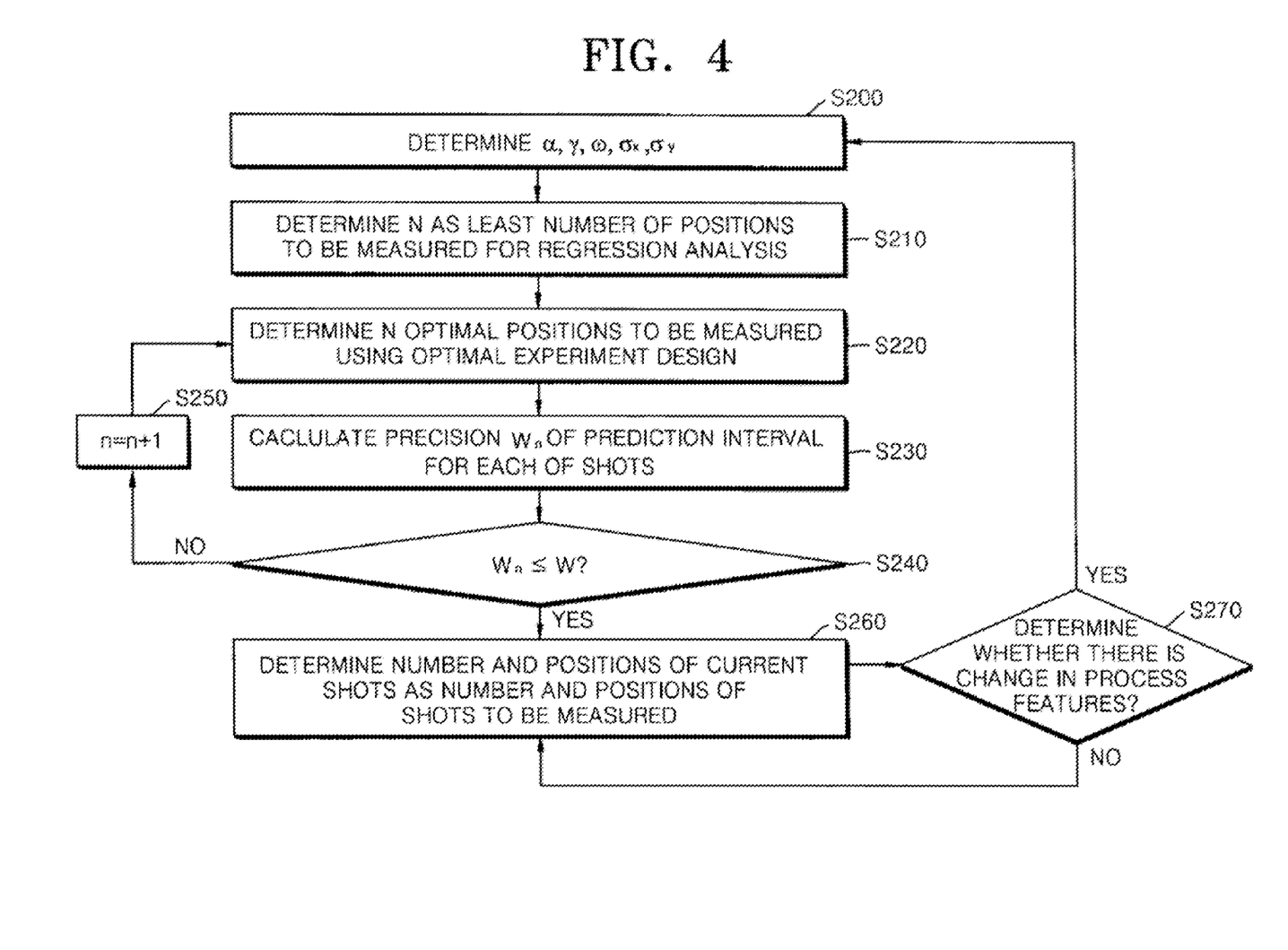
FIG. 4 is a flowchart illustrating a dynamic sampling method according to an embodiment of the present invention.

FIG. 4 is a flowchart illustrating a dynamic sampling technique according to an embodiment of the present invention. Referring to FIG. 4, in operation S200, $\alpha$, $\gamma$, w, $\sigma_x$, and $\sigma_y$ are determined as already described above. In operation S210, n, which is the number of shots to be measured, is determined as the least number of positions to be measured for regression analysis. The number n may be obtained by considering process features. In operation S220, n optimal positions to be measured are determined. In operation S230, a desired precision $w_n$ of a prediction interval for each of the shots is calculated.

In operation S240, $w_n$ and w, which is $(L-U)/2$, are compared with each other. If it is determined in operation S240 that $w_n$ is greater than w, the process proceeds to operation S250. In operation s250, n is changed into n+1 and optimal positions to be measured are determined again. If it is determined in operation S240 that $w_n$ is less than or equal to w, the process proceeds to operation 5260. In operation S260, the number and positions of current shots are determined to be the number and positions of shots to be measured. In operation S270, it is determined whether there is a change in the process features. If it is determined in operation S270 that there is a change in the process features, the process returns to operation S200 to determine the $\alpha$, $\gamma$, w, $\sigma_x$, and $\sigma_y$ again. If it is determined in operation S270 that there is no change in the process features, the number and positions of current shots are determined to be the number and positions of shots to be measured.

IV. Restoring Data when Erroneous Data is Detected or Measured Data is Missing

Erroneous data refers to data that is unusually greater than other measurement data or data that shows completely a different tendency from other measurement data. For example, when overlay marks are damaged by particles on a wafer or by other processing, erroneous data may be caused and in a worse case scenario, the erroneous data may not be measured. It is well known that erroneous data distorts regression analysis results. In particular, when an overlay alignment error is analyzed using a high order regression analysis model for accurate correction of the overlay alignment error, measurement data may be missing, thereby causing serious distortion.

Figure 5:
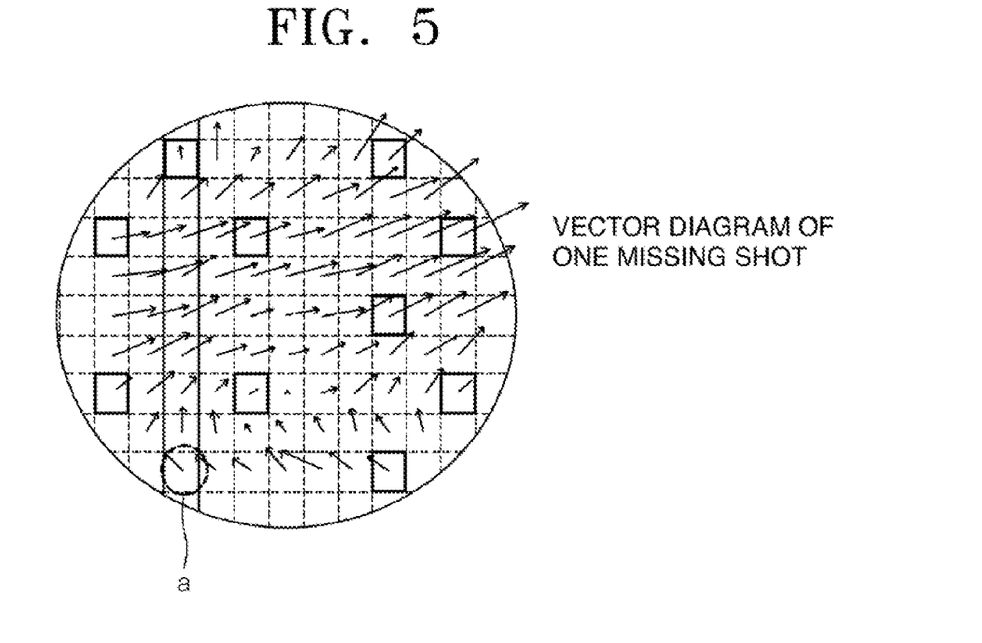
FIG. 5 is a diagram illustrating a case where measurement data for 1 shot among 11 shots to be measured is missing.
Figure 6:
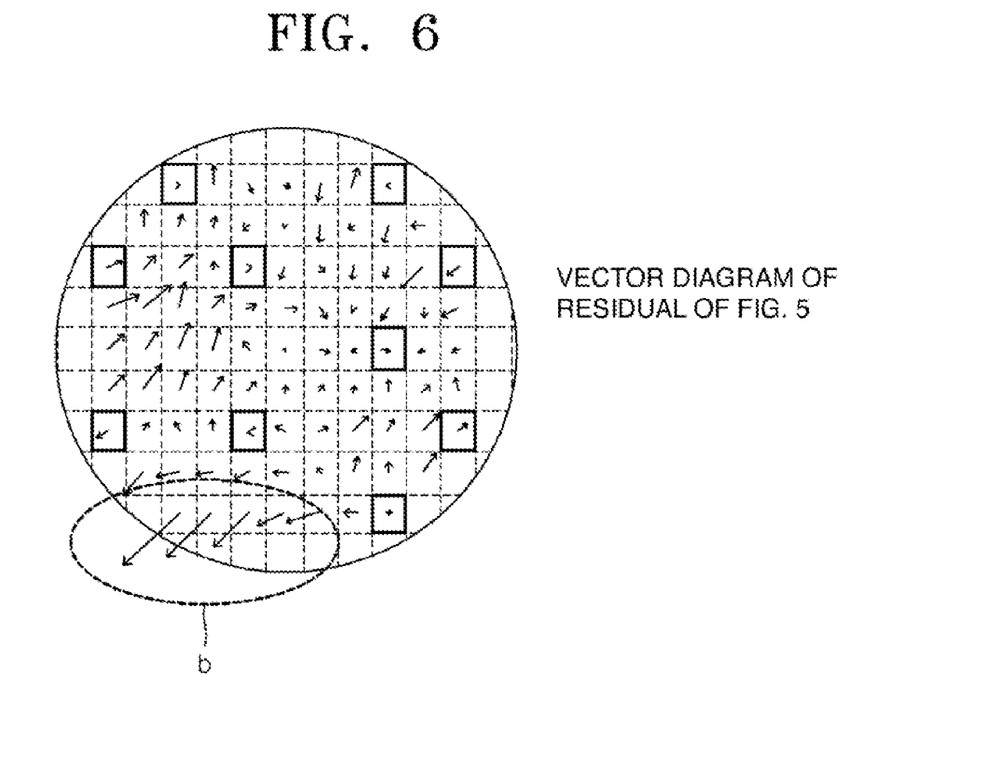
FIG. 6 is a diagram illustrating a residual obtained by high order regression analysis using the other 10 measurement data except the 1 missing measurement data illustrated in FIG. 5.

FIG. 5 is a diagram illustrating a case where measurement data of one shot "a" of 11 shots to be measured is missing. The shot "a" whose data is missing is indicated by a ring, and the other 10 shots are indicated by square boxes. FIG. 6 is a diagram illustrating a residual in high order regression analysis using measurement values of only the other 10 shots indicated by the square boxes.

Referring to FIG. 5, an overlay alignment error measured on each of the shots is represented by a vector. That is, all the shots were measured, regression analysis was performed using measurement data of only some of all the shots, and measurement data estimation accuracy for the remaining shots was evaluated. Although the 11 shots are measured, when the measurement data of the shot "a" is missing, residuals "b" for shots around the shot "a" whose measurement data is missing increases as shown in FIG. 6. When regression analysis is performed using the missing measurement data, overlay alignment error estimation for the shots around the shot "a" whose measurement data is missing is not accurately performed.

If another shot near the shot "a" whose measurement data is missing is measured, although the one measurement data is missing, the effect of the missing measurement data of the another shot may not be as great as shown in FIG. 6. However, when a dynamic sampling method is used, even when only one measurement data is missing, such a problem as shown in FIG. 6 arises. One aspect of the present invention is to overcome the effects of the missing measurement data as shown in FIG. 6 by achieving analysis accuracy with a least number of measurements, and to improve productivity.

Restoring missing data according to an embodiment of the present invention includes performing first order regression analysis using measurement data other than missing measurement data, calculating an estimate of the missing measurement data using a first order regression analysis model, restoring the missing data using the calculated estimate, and performing original high order regression analysis using the measurement data and the restored data.

Figure 7:
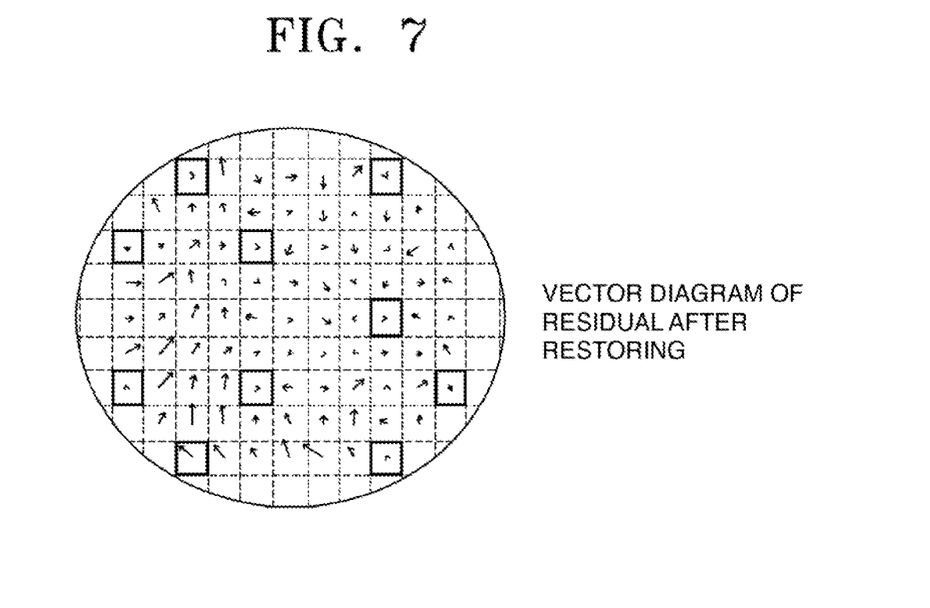
FIG. 7 is a diagram illustrating a residual obtained by restoring the missing measurement data illustrated in FIG. 5 and performing regression analysis using the measurement data for the other 10 shots and the restored measurement data for the 1 shot.

FIG. 7 is a diagram illustrating a residual after restoring the missing data illustrated in FIG. 6 according to the method for restoring missing data of the present embodiment. Referring to FIG. 7, once the missing data is restored according to the present embodiment, estimation of overlay alignment errors for the shots around the shot "a" whose measurement data was missing can be more accurately performed.

The method for restoring missing data may be used to detect erroneous data. If erroneous data is detected, regression analysis is typically performed by removing the detected erroneous data and resuming regression analysis using data other than the erroneous data. However, the typical approach may raise problems similar to those with the missing measurement data. Accordingly, according to the present embodiment, erroneous data is detected, the detected erroneous data is considered as missing data, the erroneous data considered as the missing data is restored by the aforesaid method for restoring missing data, and then regression analysis is performed.

Erroneous data may be detected using a detection component of the semiconductor measurement device by performing first order regression analysis, even when high order regression analysis is to be performed, calculating statistics, such as standardized residuals, studentized residuals, and studentized deleted residuals, and detecting data, whose statistics are greater than specific values, as erroneous data. The reason why the first order regression analysis is performed to detect the erroneous data is that, when the number of measurement data is low and high order regression analysis is performed, residuals for all data are reduced, thereby making it difficult to detect the erroneous data.

Figure 8A:
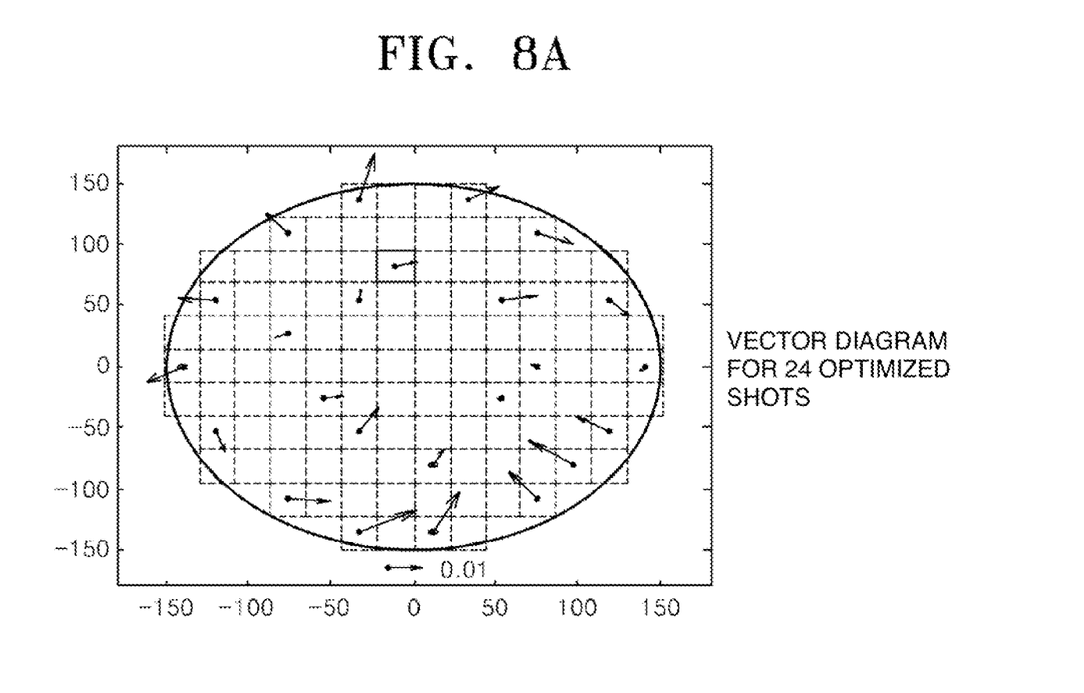
FIGS. 8A and 8B are diagrams illustrating estimates of overlay alignment errors for optimized 24 shots and all shots, respectively, when erroneous data is not included.
Figure 8B:
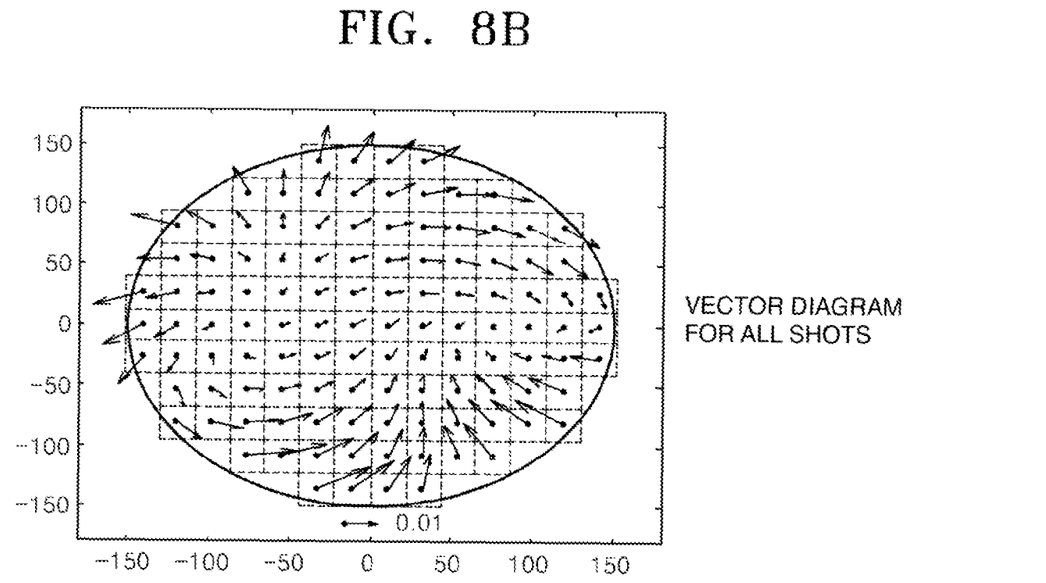
Figure 9A:
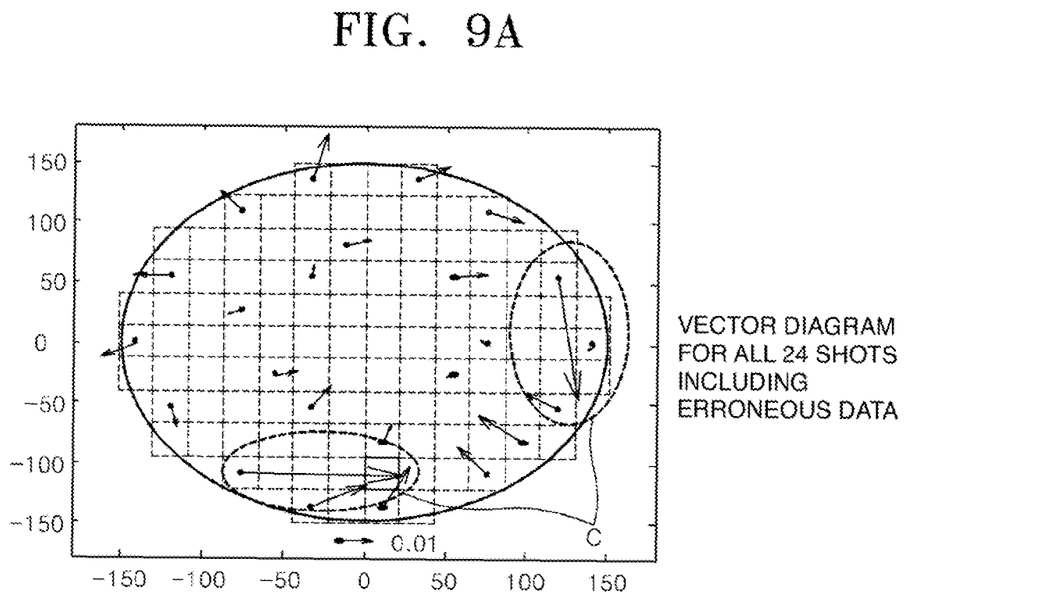
FIGS. 9A and 9B are diagrams illustrating estimates of overlay alignment errors for the optimized 24 shots and all the shots, respectively, when erroneous data is intentionally included.
Figure 9B:
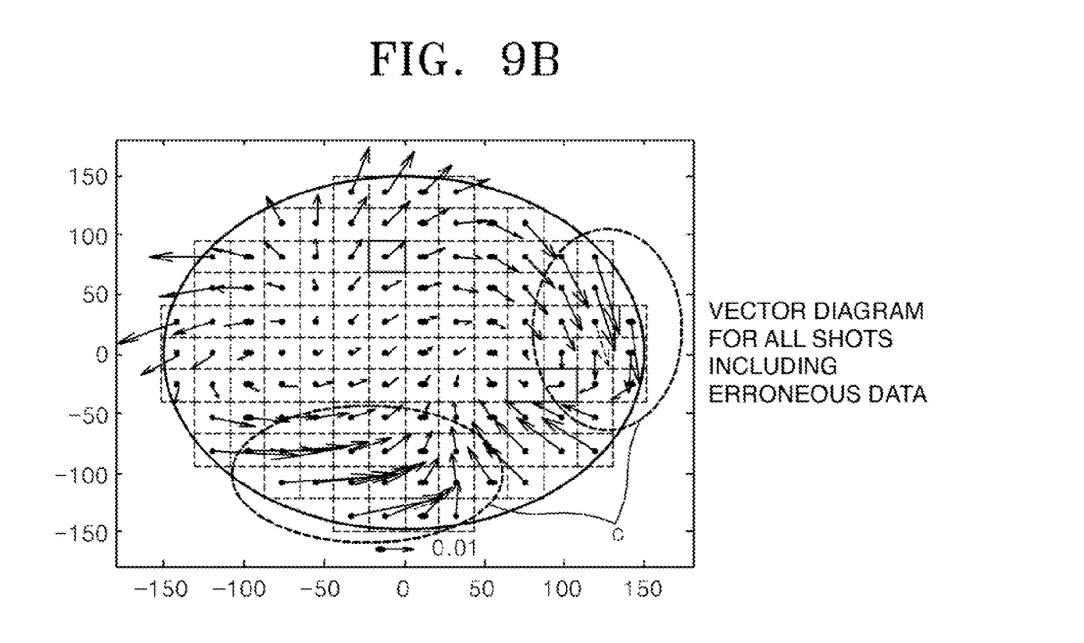

FIGS. 8A and 8B are diagrams illustrating estimates of overlay alignment errors for optimized 24 shots and all shots when no erroneous data is included. FIGS. 9A and 9B are diagrams illustrating estimates of overlay alignment errors for the optimized 24 shots and all the shots when erroneous data c is intentionally included.

In detail, FIG. 8A illustrates results obtained by measuring 24 shots whose positions are optimized using an optimizing method among 112 shots on a wafer of a device and then analyzing overlay alignment errors using a third order regression analysis model. FIG. 8B illustrates estimates of all the shots obtained using the measured overlay alignment errors illustrated in FIG. 8A. In FIG. 8B, the overlay alignment errors are represented by vectors. FIG. 9A illustrates results obtained by intentionally including erroneous data "c" of two shots in measurement data of the 24 shots and performing regression analysis. FIG. 9B illustrates estimates of all the shots obtained by performing regression analysis on the measurement data including the erroneous data illustrated in FIG. 9A. As shown, analysis results of shots around the shots in which the erroneous data "c" was detected are severely distorted.

Figure 10:
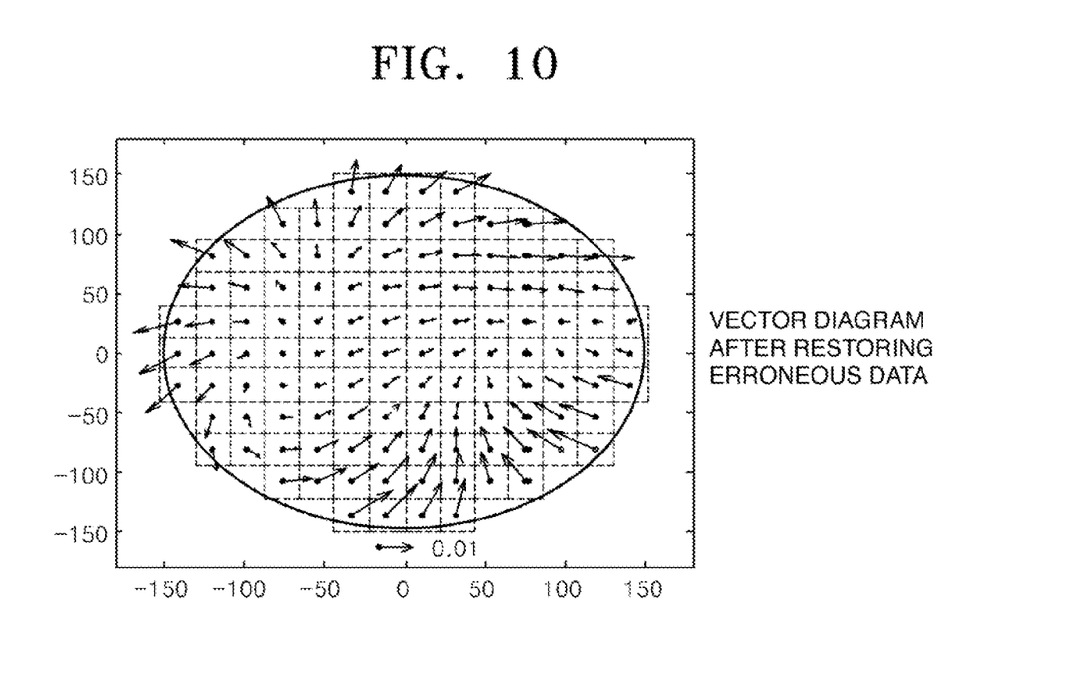
FIG. 10 is a diagram illustrating estimates of overlay alignment errors for all the shots using analysis results of the optimized 24 shots after the erroneous data is restored using a restoring method according to an embodiment of the present invention.

FIG. 10 is a diagram illustrating estimates of overlay alignment errors for all the shots using analysis results of the optimized 24 shots after the erroneous data is restored using a restoring method according to an embodiment of the present invention. Referring to FIG. 10, the regression analysis results obtained by detecting and restoring the erroneous data using the aforesaid method is only slightly different from the regression analysis results illustrated in FIG. 8 for the measurement data before including the erroneous data, but the difference is not great, thereby confirming that that the erroneous data is detected and well restored.

A least squares method may be used as a regression analysis method. The least squares method calculates a regression coefficient that minimizes a residual sum of squares of all measurement data for a given regression analysis model. Analysis software systems provided by overlay alignment error measurement equipment manufacturers may use the least squares method.

However, the least squares method may considerably distort analysis results when there is erroneous data. Accordingly, the erroneous data must be considered to use the least squares method. A robust regression analysis method designed to minimize the distortion of analysis results due to erroneous data can stably obtain analysis results without a data pre-process of detecting erroneous data and treating the erroneous data.

A representative robust regression analysis method is an M-estimation method. While a typical least squares method obtains Kx and Ky satisfying $$\MIN_{K_x} \sum_{i=1}^{n} (\varepsilon_{xi})^2 \cdot \MIN_{K_y} \sum_{i=1}^{n} (\varepsilon_{yi})^2 \tag{7}$$

for residuals $\epsilon_{xi}$ and $\epsilon_{yi}$ as in Equation 1, an M-estimation method generalizes this and obtains $K_x$ and $K_y$ satisfying $$\MIN_{K_x} \sum_{i=1}^{n} \rho(\varepsilon_{xi}), \MIN_{K_y} \sum_{i=1}^{n} \rho(\varepsilon_{yi}). \tag{8}$$

However, an estimate of a regression coefficient in Equation 8 is affected by variances of the $\epsilon_{xi}$ and $\epsilon_{yi}$ due to the function ρ. Hence, in order for the estimate of the regression coefficient not to be affected by the variances of the $\epsilon_{xi}$ and $\epsilon_{yi}$, Equation 8 may be rewritten as $$\MIN_{K_x} \sum_{i=1}^{n} \rho\left(\frac{\varepsilon_{xi}}{s_{rx}}\right) = \MIN_{K_x} \sum_{i=1}^{n} \rho\left(\frac{dx_i - F(x_i, y_i)K_x}{s_{rx}}\right) \tag{9}$$

$$\MIN_{K_y} \sum_{i=1}^{n} \rho\left(\frac{\varepsilon_{yi}}{s_{ry}}\right) = \MIN_{K_y} \sum_{i=1}^{n} \rho\left(\frac{dy_i - F(x_i, y_i)K_y}{s_{ry}}\right)$$

where $s_{rx}$ and $s_{ry}$ are robust estimators of $\sigma_x$ and $\sigma_y$. Here, $K_x$ and $K_y$ satisfying Equation 9 may be obtained by differentiating Equation 9 with respect to $K_x$ and $K_y$ and obtaining a solution of Differential Equation 10 with zero (0) on the right-hand side.

$$\sum_{i=1}^{n} \rho'\left(\frac{dx_i - F(x_i, y_i)K_x}{s_{rx}}\right) F(x_i, y_i) = 0 \quad (10)$$

$$\sum_{i=1}^{n} \rho'\left(\frac{dy_i - F(x_i, y_i)K_y}{s_{ry}}\right) F(x_i, y_i) = 0.$$

The solution of Equation 10 may be obtained by a nonlinear optimization method, but is generally obtained by an iteratively reweighted least squares (IRLS) method that is easily performed using a computer program. A robust regression analysis method using an IRLS method is performed as follows. Although $K_x$ is calculated in the following, $K_y$ may also be calculated in the same manner. The robust regression analysis method is performed by calculating $\hat{K}_x = (X^T X)^{-1} X^T dx$ using the least squares method, and updating a weight matrix $W_x$ using the calculated $\hat{K}_x$ as follows.

$$W_x = diag(wx_1, wx_2, \ldots, wx_x) \quad (11)$$

$$wx_i = w(zx_i) = \begin{cases} \frac{\rho'(zx_i)}{(zx_i)} & \text{if } zx_i \neq 0 \\ 0 & \text{if } zx_i = 0 \end{cases}$$

where $$zx_i = \frac{dy_i - F(x_i, y_i)K_y}{s_{ry}}$$

is a standardized residual, and w is a weight function. The weight function "w" may be an Andrew function, a Bisquare function, a Cauchy function, a Fair function, or a Huber function.

Next, $\hat{K}_x$ is updated using the updated weight matrix $W_x$ as follows.

$$\hat{K}_x = (X^T W_x X)^{-1} X^T W_x dx \quad (12).$$

After the updated $\hat{K}_x$ and $\hat{K}_x$ before being updated are compared with each other, if a difference therebetween is greater than a threshold, Equations 11 and 12 are repeatedly solved, and otherwise, $\hat{K}_x$ becomes a final regression coefficient.

Figure 11:
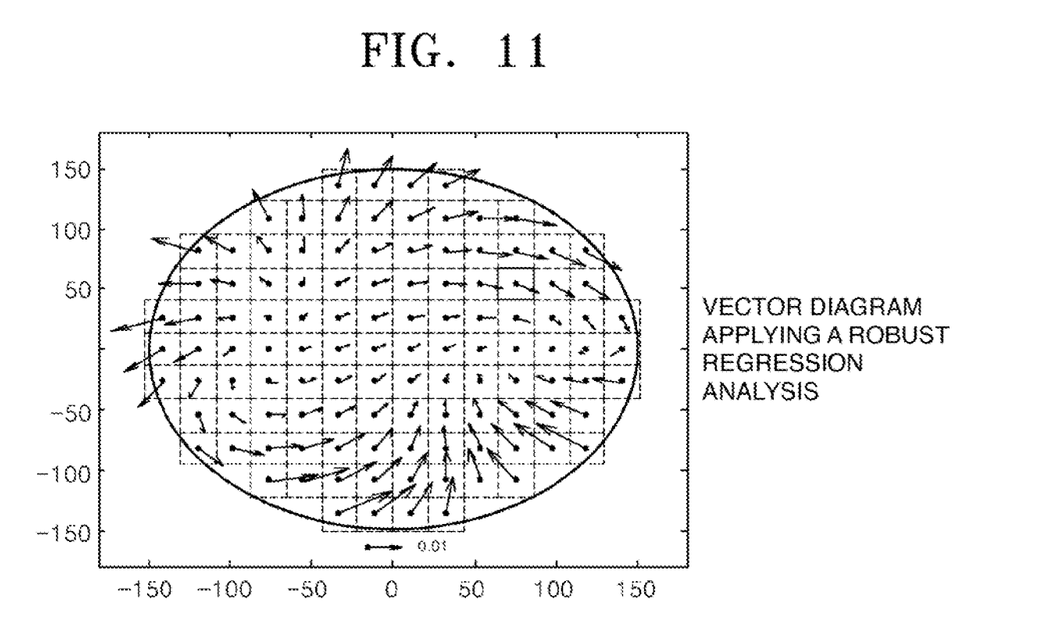
FIG. 11 is a diagram illustrating results obtained by applying a robust regression analysis method to measurement data including the erroneous data illustrated in FIG. 9A.

FIG. 11 is a diagram illustrating results obtained by applying a robust regression analysis method to the measurement data including the erroneous data illustrated in FIG. 9A. The robust regression analysis may be performed using a correction component of the semiconductor measurement device. The results are estimates for all the shots. Referring to FIG. 11, the results obtained by applying the robust regression analysis method to the measurement data, including the erroneous data illustrated in FIG. 9A, are almost the same as the regression analysis results for the measurement data before the erroneous data is included, as illustrated in FIG. 8B. The robust regression analysis method can effectively eliminate the effect of the erroneous data.

As described above, the measurement system according to the present invention can be structured to obtain a regression coefficient close to a true value by establishing an optimal criterion that maximizes $(X^T X)$ of a matrix X of a function for second or higher order regression analysis, and may be performed as a method.

Also, the measurement system according to the present invention can be structured to determine optimal targets to be measured according to a regression analysis model and process dispersion by selecting a least number of targets to be measured making $100(1-\gamma)$ % certain that the length of a $100(1-\alpha)$ % prediction interval for an estimate of an overlay measurement error is less than 2w. Disclosed herein is also a method to perform the same.

Moreover, the measurement system according to the present invention can be structured to eliminate the effect of missing data or erroneous data by restoring the missing data or the erroneous data. A measurement method to perform the same can also be used.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor measurement method to correct measurement error data of a semiconductor wafer, the method comprising:
   providing a measurement system for:
      obtaining measurement data in the semiconductor wafer;
      performing a first order regression analysis using the measurement data;
      calculating an estimate of erroneous data using the first order regression analysis;
      restoring the erroneous data using the calculated estimate;
      performing a second or higher order regression analysis using the measurement data and the restored data; and
      correcting measurement errors in the semiconductor wafer based on the second or higher order regression analysis.

2. The semiconductor measurement method of claim 1, wherein the erroneous data is missing data.

3. The semiconductor measurement method of claim 1, wherein the measurement data is any one selected from a group consisting of overlay alignment and thickness.

4. The semiconductor measurement method of claim 1, wherein the measurement errors are overlay alignment errors in a photolithographic process.

5. The semiconductor measurement method of claim 1, wherein the measurement method includes restoring the erroneous data by filtering the data using a weight function.

6. The semiconductor measurement method of claim 5, wherein the weight function is any one selected from a group consisting of an Andrew function, a Bisquare function, a Cauchy function, a Fair function, and a Huber function.

7. A semiconductor measurement method to correct measurement error data of a semiconductor wafer, the method comprising:
   providing a measurement system for:
      selecting a group of n regions to be measured from a plurality of m regions of the semiconductor;
      obtaining measurement data of the group of n regions;
      performing a first order regression analysis using the measurement data;
      calculating an estimate of erroneous data using the first order regression analysis;
      restoring the erroneous data using the calculated estimate;
      performing a second or higher order regression analysis using the measurement data and the restored data; and correcting measurement errors for the semiconductor wafer based on the second or higher order regression analysis.

8. The semiconductor measurement method of claim 7, wherein the erroneous data is missing data.

9. The semiconductor measurement method of claim 7, wherein the measurement data is any one selected from a group consisting of overlay alignment and thickness.

10. The semiconductor measurement method of claim 7, wherein the measurement method includes restoring the erroneous data by filtering the data using a weight function.

11. The semiconductor measurement method of claim 10, wherein the weight function is any one selected from a group consisting of an Andrew function, a Bisquare function, a Cauchy function, a Fair function, and a Huber function.

* * * * *